United States Patent [19]

Kumomi et al.

[11] Patent Number: 5,723,348
[45] Date of Patent: Mar. 3, 1998

[54] METHOD OF MAKING A LIGHT-EMITTING DEVICE

[75] Inventors: Hideya Kumomi, Yokohama; Takao Yonehara, Atsugi, both of Japan

[73] Assignee: Canon Kabushiki Kaisha, Tokyo, Japan

[21] Appl. No.: 598,623

[22] Filed: Feb. 12, 1996

Related U.S. Application Data

[62] Division of Ser. No. 428,514, Apr. 25, 1995, abandoned.

[30] Foreign Application Priority Data

Apr. 25, 1994 [JP] Japan .................... 6-107467

[51] Int. Cl.$^6$ .............. H01L 21/265; H01L 21/00; H01L 21/203; H01L 21/205
[52] U.S. Cl. ................. 437/23; 437/37; 437/127
[58] Field of Search .................... 257/103, 102; 437/23, 37, 127, 129, 238; 148/DIG. 99

[56] References Cited

U.S. PATENT DOCUMENTS

| | | | |
|---|---|---|---|
| 4,746,621 | 5/1988 | Thomas et al. | 437/37 |
| 4,885,261 | 12/1989 | Yoshikawa | 437/238 |
| 5,397,920 | 3/1995 | Tran | 257/102 X |

FOREIGN PATENT DOCUMENTS 54-06477  3/1979  Japan .................... 257/102

OTHER PUBLICATIONS

D.J. DiMaria, et al. "Electroluminescence Studies in silicon dioxide films containing tiny silicon islands", J. Appl. Phys. 56, 1984, pp. 401–416.

Primary Examiner—Brian Dutton
Attorney, Agent, or Firm—Fitzpatrick, Cella, Harper & Scinto

[57] ABSTRACT

A light-emitting device, in which a film obtained by ion-implanting ions that can become a semiconductor material into an oxide film forms at least a part of a light-emitting layer.

9 Claims, 3 Drawing Sheets

METHOD OF MAKING A LIGHT-EMITTING DEVICE

This application is a division of application Ser. No. 08/428,514, filed Apr. 25, 1995, now abandoned.

BACKGROUND OF THE INVENTION

1. Field of the Invention

The present invention concerns a light-emitting device. More particularly, the invention relates to a light-emitting device using a semiconductor, which is independently used as a light source or which can be integrated in a semiconductor integrated circuit.

2. Related Background Art

Heretofore, EL (Electro Luminescence) devices, which are one type of light-emitting device using a semiconductor, have been limited to direct transition compound semiconductor materials, typified by ZnS. On the other hand, Si is unrivaled for use in high-integration electric circuits for driving the devices. Thus, attempts have been made to epitaxially grow a compound semiconductor as a material for EL device on a single silicon crystal in order to build an EL device integrated with a driving circuit in a monolithic fashion, but no attempt has succeeded.

Further, another method of achieving a monolithic arrangement to obtain an EL device using Si as a raw material and matching well with the silicon process has been desired. One method reported for constructing such a device is the method in which a $SiO_x$ film deposited by the CVD process is subjected to a heat treatment to form silicon particles in the film (D. J. DiMaria, J. R. Kirtly, E. J. Pakulis, D. W. Dong, T. S. Kuan, F. L. Pesavento, T. N. Thesis and J. A. Cutro, J. Appln. Phys., Vol. 56, P401, 1984).

The $SiO_x$ film deposited by the CVD process, however, cannot always be said to be a good film with respect to density and impurity levels. Therefore, the characteristics of the interface between the silicon particles themselves, formed after the heat treatment and the oxide film surrounding them are poor, so that luminous efficacy is insufficient. Thus, at present, no satisfactory devices have been achieved.

SUMMARY OF THE INVENTION

An object of the present invention is to provide an EL device arranged to be monolithic with a driving circuit thereof. More particularly, the object is to provide an EL device which is adapted to the silicon process for building the drive circuit in a silicon substrate and which can be formed on the same substrate as an integrated circuit consisting of semiconductor devices such as transistors. Specifically, providing an excellent EL device using Si as a raw material is desired.

A light-emitting device of the present invention is characterized in that an oxide film in which ions are ion-implanted forms at least a part of a light-emitting layer.

In the present invention, ions that can become a semiconductor material are implanted into an oxide film by ion implantation that can control an amount of impurity with sufficient accuracy in the semiconductor process, whereby a light-emitting layer, precisely controlled in the amount and size of semiconductor particles, can be formed. As a result, an excellent light-emitting device is constructed for example of Si as a raw material.

The light-emitting device of the present invention is a light-emitting device using the $SiO_x$ film, and can be built as integrated with a driving circuit thereof on the same silicon substrate.

DESCRIPTION OF THE PREFERRED EMBODIMENT

The present invention will be described in detail.

Figure 1:
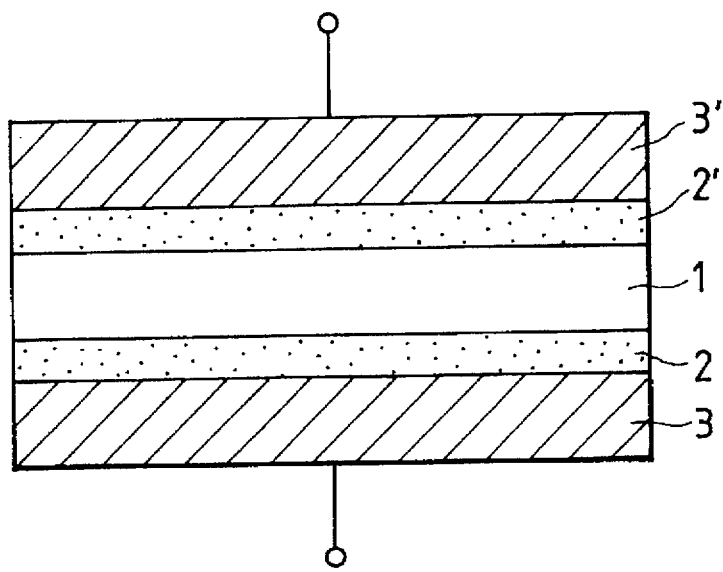
FIG. 1 is a schematic drawing to show an example of the light-emitting device according to the present invention.

FIG. 1 is a cross section to show a first embodiment of the light-emitting device according to the present invention. The present embodiment is an ac drive EL device. A light-emitting layer 1, formed by the method detailed below, is sandwiched between insulating layers 2, 2', and the lamination is interposed between electrodes 3, 3' of a conductive material. Here, the two insulating layers or the two electrodes do not have to be made of a same material.

Further, an interface between the light-emitting layer 1 and the insulating layer 2, 2' does not always have to be steep, but may be continuously changing as long as the dielectric strength of insulating layer is retained against a drive voltage.

When an ac voltage is applied between the electrodes 3, 3' in the light-emitting device in the above structure, semiconductor particles contained in the light-emitting layer 1 present light emission. For taking out the emitted light in the direction perpendicular to the layers in the light-emitting device, at least one pair of insulating layer and electrode must be transparent or semitransparent to the emitted light.

Figure 2:
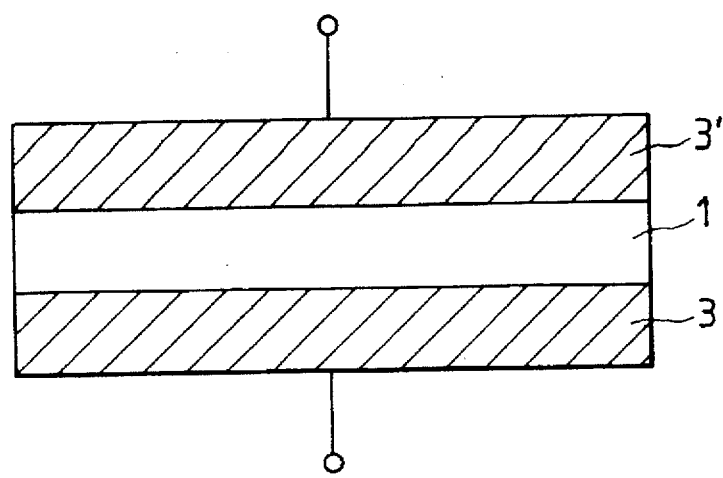
FIG. 2 is a schematic drawing to show another example of the light-emitting device according to the present invention.

FIG. 2 is a cross section to show a dc drive EL device as a second embodiment of the light-emitting device according to the present invention. In the present embodiment the light-emitting layer 1 is sandwiched directly between the electrodes 3, 3' and, different from the first embodiment, the light-emitting layer 1 needs to have a resistance low enough to enable an electric current to flow thereinto from the outside. When a dc voltage is applied between the electrodes 3, 3' in the light-emitting device as so arranged, semiconductor particles contained in the light-emitting layer 1 emit light.

Figure 3A:
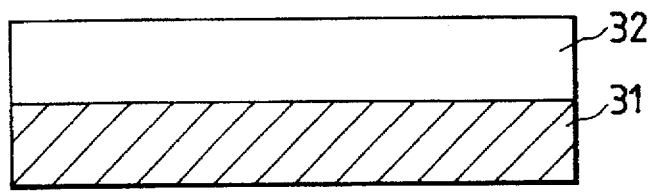
FIGS. 3A to 3C are schematic drawings to show an example of production steps of the light-emitting device according to the present invention.
Figure 3B:
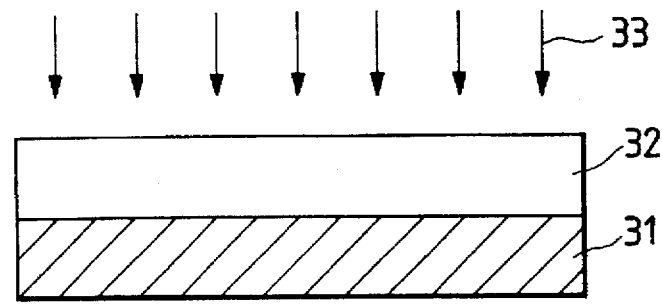
Figure 3C:
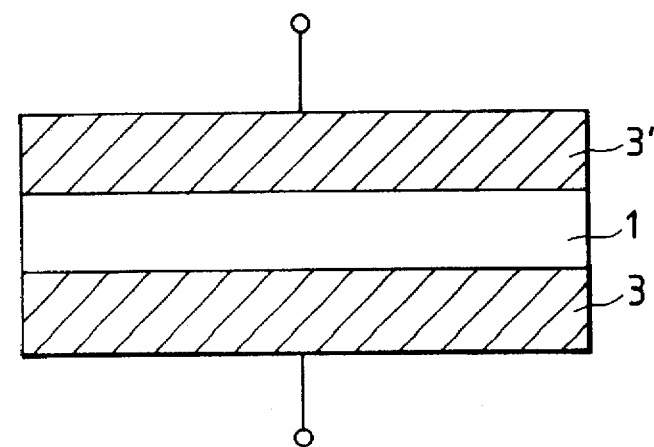

FIGS. 3A to 3C are cross sections to show steps for producing the light-emitting device of the present invention.

First, an oxide film 32 is formed on a conductive base 31 (FIG. 3A). This base 31 will function as either one electrode in the light-emitting device later on. For example, if the base 31 is a Si substrate, the oxide film 32 is obtained as a good oxide film by oxidizing the substrate. Alternatively, a $SiO_2$ film is first deposited on the base and the resultant structure is preliminarily subjected to a sufficient heat treatment so as to improve the quality of the film. The resulting laminate may be used. For the light-emitting device of the present invention, materials other than Si may be suitably applied in order to construct a good EL device.

In the present invention, the film thickness of the oxide film is generally in the range of 10 nm to 100 μm, taking the luminous efficacy and effective field into account, and preferably, in the range of 100 nm to 1 μm.

Next, ions 33 are implanted into the oxide layer 32 from the surface thereof (FIG. 3B). The ions implanted in the present invention are preferably those that can become a semiconductor material. Specifically, the following ions are applicable:

ions resulting from elements belonging to Group IV in the periodic table, i.e., Si, Ge;

ions resulting from elements that can form Group II-Group VI compound semiconductors, i.e., Zn, Cd, Hg, Se, Te, Po;

ions resulting from elements that can form Group III-Group V compound semiconductors, i.e., Al, Ga, In, Tl, P, As, Sb, Bi.

In the present invention, an amount of the implanted ions changes depending upon ion species implanted, but it is generally in the range of $10^{10}$ cm$^{-2}$ to $10^{22}$ cm$^{-2}$, taking the luminous efficacy and solid solution limit into account, and preferably in the range of $10^{14}$ cm$^{-2}$ to $10^{22}$ cm$^{-2}$.

Implantation energy of ions must be set so as to obtain an optimum range for the film thickness of the oxide film 32, depending upon the type of the light-emitting device as described below. Namely, in case of the ac drive EL device as shown in FIG. 1, at least a region facing the base 31, in the oxide film 32 needs to be an insulating layer and thus, the range of ion implantation must be shallower than it.

In case of the dc drive device shown in FIG. 2, leaving a high-resistance layer is not preferred, and thus, implantation should be conducted in a range deep enough at least to reach the interface. In either case, the ion implantation may be carried out in multiple steps with different energy and doses in order to adjust the distribution of implanted ions in the oxide film 32.

The heat treatment is next conducted. This aggregates the implanted ions in proper degree and provides the ions with a light-emitting property by the quantum size effect of semiconductor crystal particles thus formed. Thus, conditions of the heat treatment should be adjusted to form particles in sizes capable of exhibiting such a light-emitting property. For example, if the heat treatment is insufficient because of a too low a temperature or because of too short time, the emitted light from the oxide layer as observed prior to the heat treatment will vanish.

An excessive heat treatment increases the average size of semiconductor particles because of further growth of crystalline particles, which nullifies the quantum effect, also resulting in loss of the light-emitting property.

The heat treatment may be, for example, normal furnace annealing, rapid thermal annealing with an infrared lamp, or irradiation of an energy beam such as laser beam, electron beam, particle beam, or x-rays.

Next, only for the ac drive EL device of FIG. 1, and if the dielectric strength is insufficient near the surface of the oxide film 32, an insulating film is formed on the surface. This step is unnecessary if the range of semiconductor ion implantation is deep enough from the surface. This step may be done prior to the above heat treatment. The insulating film may be any film insofar as it is excellent in insulating property and voltage withstand, such as a silicon dioxide film or silicon nitride film.

Finally, the upper electrode 3' is formed (FIG. 3C). Specific examples of a material for the electrode are metals such as aluminum, gold, or tungsten, and compounds thereof. Where the emitted light is taken out through the electrode, it is made of an optically transparent material such as indium tin oxide.

EXAMPLES

Example 1

An ac drive EL device shown in FIG. 1 was fabricated.

First, a SiO$_2$ film of film thickness 300 nm was deposited by atmospheric pressure CVD on a surface of a Si single crystal substrate with a specific resistivity of not more than 0.01 Ωcm. The resulting structure was thermally treated at a temperature of 1000° C. in a nitrogen atmosphere for about one hour to raise density of the film, thereby decreasing the film thickness by about 15%.

Si ions accelerated up to the energy of 100 keV were implanted in a dose of 2×10$^{16}$ cm$^{-2}$ into the surface of the oxide film. With this energy the implanted ions rarely reach the interface to the Si substrate.

Next, in order to maintain the dielectric strength of the surface of the oxide layer, a further SiO$_2$ film was again deposited in a film thickness of 50 nm by atmospheric pressure CVD. The resulting structure was subjected to a heat treatment at a temperature of 1050 ° C. in a nitrogen atmosphere for about three hours, and then the film presented red photoluminescence in the visible region.

Finally, the oxide film on the back surface of the substrate was removed and Al electrodes were formed on both surfaces of the substrate. Then the substrate was cut into chips about 5 mm square. When an ac voltage of 300 V and 5 kHz was applied between the both electrodes in the thus fabricated device, electroluminescence similar to photoluminescence was observed from the end face of the substrate.

Example 2

A dc drive EL device shown in FIG. 2 was fabricated. Fabrication steps thereof are described below.

First, a SiO$_2$ film of film thickness 100 nm was formed by normal thermal oxidation on a surface of a Si single crystal substrate with a specific resistivity of not more than 0.01 Ωcm. Two steps of ion implantation were carried out on the surface, one under conditions of 70 keV and 1×10$^{16}$ cm$^{-2}$ and the other under conditions of 30 keV and 2×10$^{15}$ cm$^{-2}$. This makes a distribution of implanted Si nearly uniform in the film.

Next, the resulting structure was thermally treated at a temperature of 1100 ° C. in a nitrogen atmosphere for one and a half hours, and then the film presented orange photoluminescence in the visible region.

Finally, an ITO film was formed in a film thickness of 400 nm; while the oxide film on the back face of the substrate was removed and an Al electrode was formed thereon. When a dc voltage of 20 V was applied to between the both electrodes in the light-emitting device thus fabricated, electroluminescence similar to photoluminescence was observed through the ITO film.

Example 3

An ac drive EL device was fabricated.

First, a SiO$_2$ film of film thickness 350 nm was deposited by atmospheric pressure CVD on a surface of a Si single crystal substrate with a specific resistivity of not more than 0.01 Ωcm, and the resulting structure resultant was subjected to a heat treatment at 950 ° C. in a nitrogen atmosphere for more than one hour. Ge ions accelerated up to the energy of 90 keV were implanted in a dose of $1 \times 10^{16}$ cm$^{-2}$ into the surface, and a heat treatment was conducted at 900° C. in a nitrogen atmosphere for two hours. Then the film presented orange photoluminescence in the visible region.

Finally, the oxide film on the back face of substrate was removed and Al electrodes were formed on both surfaces of the substrate. Then the substrate was cut into chips about 1 cm square. When an ac voltage of 200 V and 800 Hz was applied between both electrodes in the light-emitting device, electroluminescence similar to photoluminescence was observed from the end face of the substrate.

Example 4

A dc drive EL device was fabricated.

First, a SiO$_2$ film 80 nm thick was formed by normal thermal oxidation on a surface of a Si single crystal substrate with an electrical resistivity of not more than 0.01 Ωcm. Si ions were implanted into the surface under conditions of 35 keV and $2 \times 10^{15}$ cm$^{-2}$, and subsequently, Ge ions were implanted under conditions of 25 keV and $1 \times 10^{15}$ cm$^{-2}$. The resultant was thermally treated at 950 ° C. in a nitrogen atmosphere for one hour, and then this film presented yellow green photoluminescence in the visible region.

Finally, an ITO film was deposited in a film thickness of 300 nm, while an Al electrode was formed on the back face of substrate. When a dc voltage of 10 V was applied between these electrodes, electroluminescence similar to photoluminescence was observed from the surface.

Example 5

A dc drive EL device was fabricated.

A SiO$_2$ film of film thickness 110 nm was formed by normal thermal oxidation on a surface of a Si single crystal substrate with a specific resistivity of not more than 0.01 Ωcm. Then Ga ions were implanted into the surface under conditions of 50 keV and $1 \times 10^{15}$ cm$^{-2}$, and subsequently, As ions were implanted under conditions of 30 keV and $5 \times 10^{15}$ cm$^{-2}$. The resulting structure was thermally treated at 800° C. in a nitrogen atmosphere for one hour, and then the film presented green photoluminescence in the visible region.

Finally, an ITO film was deposited in a film thickness of 350 nm, while an Al electrode was formed on the back face of the substrate. When a dc voltage of 5 V was applied between these electrodes, electroluminescence similar to photoluminescence was observed from the surface.

Example 6

Using an SOI (Silicon on Insulator) substrate, an active matrix display apparatus in which a plurality of EL devices and drive circuits thereof were formed on the same substrate was fabricated.

Figure 4:
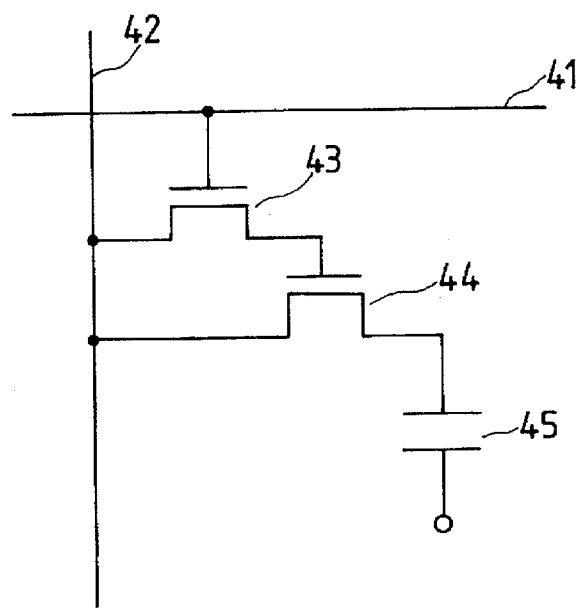
FIG. 4 is a circuit diagram of an example in which the light-emitting device of the present invention is applied to an image displaying apparatus.

FIG. 4 shows a circuit diagram of one pixel part. In the drawing numeral 41 designates a pixel selector line, 42 a data line, 43 a low-voltage access transistor, which is a p-type or n-type field-effect transistor, and 44 an n-type double-diffused field-effect transistor for high-voltage drive. For each device, the above low-voltage/high-voltage transistors are connected to the pixel selector line and the data line, the gate electrode of low-voltage transistor 43 is connected to the pixel selector line 41, the source thereof to the data line 42, the drain thereof to the gate electrode of high-voltage transistor 44, the source of the high-voltage transistor 44 to the data line 42, and the drain of transistor 44 to one electrode of the EL device 45 of the present invention.

In the present embodiment, when an address signal is applied through the pixel selector line 41 to bring the gate electrode of low-voltage transistor 43 into an on state, an address signal (high voltage, <200 V) applied to the data line 42 is transferred to the gate electrode of high-voltage transistor 44 to turn the gate electrode on. As a result, the address signal applied to the data line 42 is transferred through the high-voltage transistor 44 to the electrode of EL device 45, whereby the light-emitting layer of device emits light.

Figure 5:
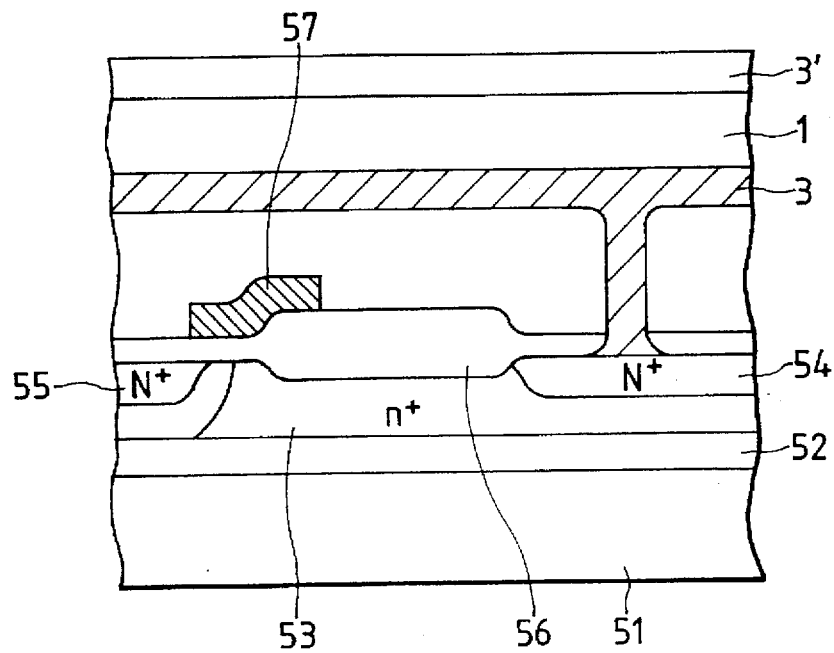
FIG. 5 is a partial cross section of the image displaying apparatus shown in FIG. 4.

FIG. 5 shows a cross section of a part of the above high-voltage transistor 44 and EL device 45. In the drawing, numeral 51 denotes a Si single crystal substrate, 52 a SiO$_2$ layer, 53 a drift region, 54 the drain, 55 the source, 56 a field oxide film (of thickness 8000 Å) for high-voltage-withstand shield, and 57 the gate electrode. Although this figure shows the dc drive EL device, the invention is by no means limited to it; the invention may be suitably applicable to construction of an ac drive device with upper and lower insulating layers. In FIG. 5, the upper electrode 3' is made of a transparent material.

Employing the above structure, EL pixels can be constructed in a high density with a decreased number of wires and can be driven at high voltages.

Providing the present embodiment further with a color filter, a color active matrix image display apparatus can be constructed.

What is claimed is:

1. A production process of a light-emitting device, comprising a step of ion-implanting ions that can become a semiconductor material into an oxide film to form at least a part of a light-emitting layer.

2. The production process of light-emitting device according to claim 1, wherein a heat treatment is conducted after said ion-implanting step.

3. The production process of light-emitting device according to claim 1, wherein a film thickness of said oxide film is in the range of 10 nm to 100 µm.

4. The production process of light-emitting device according to claim 3, wherein the film thickness of said oxide film is in the range of 100 nm to 1 µm.

5. The production process of light-emitting device according to claim 1, wherein said ions are those obtained from either one of elements Si and Ge.

6. The production process of light-emitting device according to claim 1, wherein said ions are those obtained from either one of elements Zn, Cd, Hg, Se, Te, and Po.

7. The production process of light-emitting device according to claim 1, wherein said ions are those obtained from either one of elements Al, Ga, In, Tl, P, As, Sb, and Bi.

8. The production process of light-emitting device according to claim 1, wherein said ion-implanting step is carried out in a dose in the range of $10^{10}$ cm$^{-2}$ to $10^{22}$ cm$^{-2}$.

9. The production process of light-emitting device according to claim 8, wherein said ion-implanting step is carried out in a dose in the range of $10^{14}$ cm$^{-2}$ to $10^{22}$ cm$^{-2}$.

* * * * *

UNITED STATES PATENT AND TRADEMARK OFFICE
CERTIFICATE OF CORRECTION

PATENT NO. : 5,723,348
DATED : March 3, 1998
INVENTOR(S) : HIDEYA KUMOMI ET AL.

Page 1 of 2

It is certified that error appears in the above-indentified patent and that said Letters Patent is hereby corrected as shown below:

COLUMN 1

Line 22, "device" should read --devices--.
Line 39, "treatment" should read --treatment,--.
Line 62, "constructed for example" should read --constructed, for example,--.

COLUMN 2

Line 14, "cross section" should read --cross-section--.
Line 52, "cross sections" should read --cross-section--.
Line 61, "so as" should be deleted.

COLUMN 3

Line 26, "31," should read --31--.
Line 43, "a too low a" should read --too low a--.

COLUMN 4

Line 13, "density" should read --the density--.
Line 31, "the both" should read --both--.
Line 65, "resultant" should be deleted.

COLUMN 5

Line 22, "resultant" should read --resulting structure--
Line 23, "yellow" should read --yellow---.

UNITED STATES PATENT AND TRADEMARK OFFICE
CERTIFICATE OF CORRECTION

PATENT NO. : 5,723,348
DATED : March 3, 1998
INVENTOR(S) : HIDEYA KUMOMI ET AL.

Page 2 of 2

It is certified that error appears in the above-indentified patent and that said Letters Patent is hereby corrected as shown below:

COLUMN 6

```
Line 38, "light-emitting" should read --a light-emitting--.
Line 41, "light-emitting" should read --a light-emitting--.
Line 44, "light-emitting" should read --a light-emitting--.
Line 47, "light-emitting" should read --a light-emitting--.
Line 50, "light-emitting" should read --a light-emitting--.
Line 53, "light-emitting" should read --a light-emitting--.
Line 56, "light-emitting" should read --a light-emitting--.
Line 59, "light-emitting" should read --a light-emitting--.
```

Signed and Sealed this

Fourth Day of August, 1998

Attest:

BRUCE LEHMAN

Attesting Officer

Commissioner of Patents and Trademarks